(12) United States Patent
Gohara

(10) Patent No.: US 10,826,422 B2
(45) Date of Patent: Nov. 3, 2020

(54) MOTOR CONTROL CIRCUIT, CONTROL METHOD, MOTOR DRIVE SYSTEM, ELECTRONIC DEVICE

(71) Applicant: ROHM CO., LTD., Kyoto (JP)

(72) Inventor: Yuki Gohara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 173 days.

(21) Appl. No.: 16/004,885

(22) Filed: Jun. 11, 2018

(65) Prior Publication Data

US 2018/0358914 A1 Dec. 13, 2018

(30) Foreign Application Priority Data

Jun. 12, 2017 (JP) .................. 2017-114960

(51) Int. Cl.
| | |
|---|---|
| H02K 7/14 | (2006.01) |
| H02P 23/00 | (2016.01) |
| H02P 27/08 | (2006.01) |
| H05K 7/20 | (2006.01) |
| G06F 1/20 | (2006.01) |
| G01P 3/489 | (2006.01) |

(52) U.S. Cl.
CPC .......... *H02P 23/0004* (2013.01); *G06F 1/206* (2013.01); *H02P 23/0027* (2013.01); *H02P 27/085* (2013.01); *H05K 7/20136* (2013.01); *H05K 7/20209* (2013.01); *G01P 3/489* (2013.01)

(58) Field of Classification Search
CPC ...... G01P 3/489; G06F 1/206; H02P 23/0004; H02P 23/0027; H02P 27/085; H05K 7/20136; H05K 7/20209
USPC .......................................................... 318/3
See application file for complete search history.

(56) References Cited

U.S. PATENT DOCUMENTS

| | | | | |
|---|---|---|---|---|
| 5,729,102 | A * | 3/1998 | Gotou | G11B 19/2009 318/400.13 |
| 6,483,270 | B1 * | 11/2002 | Miyazaki | G05B 19/231 318/609 |
| 2004/0134697 | A1 * | 7/2004 | Kobayashi | B60K 6/485 180/65.26 |

FOREIGN PATENT DOCUMENTS

JP 03164085 A 7/1991

* cited by examiner

*Primary Examiner* — Eduardo Colon Santana
*Assistant Examiner* — Gabriel Agared
(74) *Attorney, Agent, or Firm* — Cantor Colburn LLP

(57) ABSTRACT

A control circuit includes: a cycle counter configured to measure a cycle of revolutions per minute (RPM) signal indicating an RPM of a motor to be driven to generate a digital measurement value; and a controller configured to generate a control command based on a digital target value corresponding to a target cycle of the RPM signal and the measurement value, wherein the controller switches between a first mode in which the control command is monotonously changed and a second mode in which the control command is generated based on proportional-integral (PI) control.

15 Claims, 11 Drawing Sheets

MOTOR CONTROL CIRCUIT, CONTROL METHOD, MOTOR DRIVE SYSTEM, ELECTRONIC DEVICE

CROSS-REFERENCE TO RELATED APPLICATION

The present application claims priority under 35 U.S.C. § 119 to Japanese Patent Application No. 2017-114960, filed on Jun. 12, 2017, the entire contents of which are incorporated herein by reference.

TECHNICAL FIELD

The present disclosure relates to a motor control circuit.

BACKGROUND

The operation speed of an arithmetic processing large scale integrated circuit (LSI) such as a central processing unit (CPU), a digital signal processor (DSP), a graphics processing unit (GPU) or the like has been steadily increasing according to the recent increase in speed of computers. In this LSI, as the operation speed, i.e., a clock frequency increases, the amount of heat generation also increases. There is a problem that the heat generation of the LSI leads to thermal runaway of the LSI itself or affects peripheral circuits. Therefore, proper thermal cooling of the LSI is very important.

An example of a technique for cooling an LSI is an air cooling type cooling method using a cooling fan. In this method, for example, a cooling fan is installed to face the surface of the LSI, and cold air is blown to the LSI or a heat sink attached to the LSI by the cooling fan.

A motor drive method includes a method that controls torque (revolutions per minute: RPM) in an open loop and a method that controls it by feedback. In the open loop control, a drive voltage corresponding to a target RPM is applied to a motor. On the other hand, in the feedback control (closed loop control), the RPM of the motor is detected, and the drive voltage is adjusted such that the detection value of the RPM approaches the target value.

The present inventor has studied the feedback control of the motor, and recognized the following problems. For the feedback control of the motor, a proportional-integral (PI) controller is used. FIG. 1 is a startup waveform diagram of a motor by PI control. When the RPM of the motor stabilized at a certain RPM is changed, the motor accelerates or decelerates. In the PI control, as illustrated in FIG. 1, an overshoot exceeding the target RPM occurs at the time of acceleration. On the contrary, an undershoot below the target value occurs at the time of deceleration.

In order to solve this problem, a method for continuously changing the target RPM so as not to become discontinuous when switching the target RPM is considered. However, in a system that controls the motor according to the target RPM generated by an external processor, a process of continuously changing the target RPM is left to a processor, which is not versatile.

SUMMARY

Some embodiments of the present disclosure provide a control circuit capable of limiting overshoot or undershoot due to a change in RPM.

According to one aspect of the present disclosure, a control circuit includes: a cycle counter configured to measure a cycle of revolutions per minute (RPM) signal indicating an RPM of a motor to be driven to generate a digital measurement value; and a controller configured to generate a control command based on a digital target value corresponding to a target cycle of the RPM signal and the measurement value. The controller may switch between a first mode in which the control command is monotonously changed and a second mode in which the control command is generated based on proportional-integral (PI) control.

In some embodiments, it is possible to suppress an overshoot or an undershoot of the RPM of the motor by adaptively switching between the first mode and the second mode In some embodiments, the control command may be changed at a constant slope in the first mode. Thus, it is possible to simplify a generation circuit of the control command.

In some embodiments, the control command may be changed according to a predetermined function in the first mode. Thus, it is possible to flexibly control a change in the RPM of the motor in the first mode according to a waveform function.

In some embodiments, switching from the first mode to the second mode may be triggered depending on a ratio of the measurement value to the target value, in other words, a ratio of an actual RPM to the target RPM. Thus, it is possible to switch to the second mode after the actual RPM approaches the target RPM to some degree.

In some embodiments, switching from the first mode to the second mode may be triggered depending on an error between the target value and the measurement value.

In some embodiments, switching from the second mode to the first mode may be triggered depending on a change in the target cycle.

In some embodiments, the controller may include a ramp waveform generator configured to change the control command at a predetermined slope; a PI controller configured to generate the control command based on PI control; and a mode selector configured to switch the ramp waveform generator and the PI controller.

According to another aspect of the present disclosure, a motor drive system includes: a motor; any one of the control circuits; and a driver configured to drive the motor depending on the control command generated by the control circuit. The motor drive system may be a cooling device.

According to another aspect of the present disclosure, an electronic device includes: a processor; a fan motor configured to cool the processor; any one of the control circuits; and a driver configured to drive the fan motor depending on the control command generated by the control circuit.

In addition, any combination of the above-described elements and those obtained by mutual replacement of elements or representations of the present disclosure among methods, apparatuses, systems, and others are effective as modes of the present disclosure.

DETAILED DESCRIPTION

Figure 1:
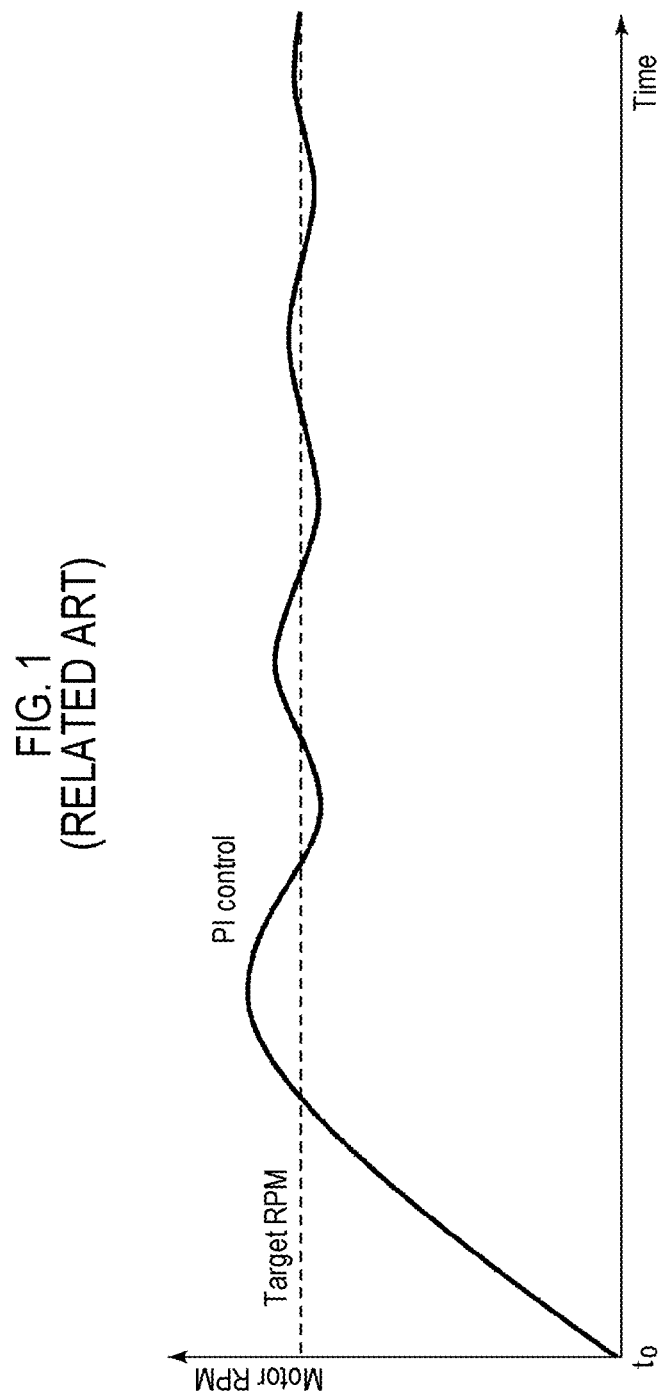
FIG. 1 is a startup waveform diagram of a motor by PI control.

Embodiments of the present disclosure will now be described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

In the present disclosure, "a state where a member A is connected to a member B" includes a case where the member A and the member B are physically directly connected or even a case where the member A and the member B are indirectly connected through any other member that does not affect an electrical connection state between the members A and B or does not impair functions and effects achieved by combinations of the members A and B.

Similarly, "a state where a member C is installed between a member A and a member B" includes a case where the member A and the member C or the member B and the member C are indirectly connected through any other member that does not affect an electrical connection state between the members A and C or the members B and C or does not impair function and effects achieved by combinations of the members A and C or the members B and C, in addition to a case where the member A and the member C or the member B and the member C are directly connected.

Figure 2:
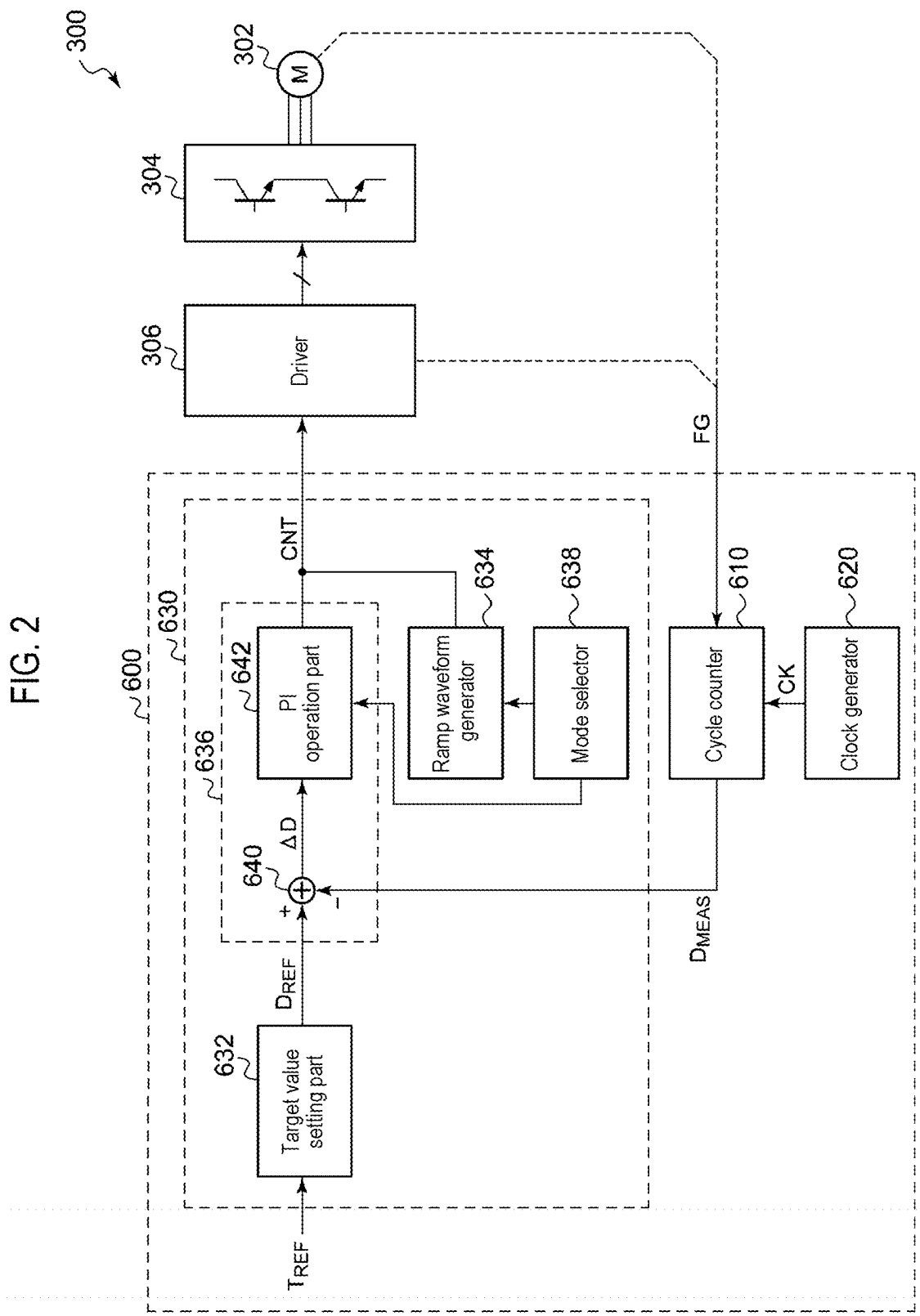
FIG. 2 is a block diagram of a motor drive system including a control circuit according to an embodiment of the present disclosure.

FIG. 2 is a block diagram of a motor drive system 300 including a control circuit 600 according to an embodiment of the present disclosure. The motor drive system 300 includes a motor 302, an inverter 304, a driver 306, and the control circuit 600.

For example, the motor 302 is a three-phase brushless DC motor, and the inverter 304 is a three-phase inverter. The control circuit 600 generates a control command CNT such that the revolutions per minute (RPM) of the motor 302 approaches a desired RPM (a target RPM). The control command CNT is a signal representing the magnitude of a drive voltage to be applied to the motor 302 and may represent a duty ratio PWM_OUT when the motor 302 is PWM-driven. The driver 306 performs switching control of the inverter 304 with the duty ratio PWM_OUT corresponding to the control command CNT.

An RPM signal FG indicating the RPM of the motor 302 is input to the control circuit 600. The RPM signal FG is a pulse signal and has a frequency proportional to the RPM of the motor 302. A method of generating the RPM signal FG is not particularly limited. In a drive system with a sensor, the RPM signal FG may be generated by converting an output of a Hall element into a rectangular wave by a comparator. In a sensorless drive system, the RPM signal FG may be generated by converting a counter electromotive force generated in the coil of the motor into a rectangular wave by a comparator.

The control circuit 600 includes a cycle counter 610, a clock generator 620, and a controller 630. The clock generator 620 generates a counter clock CK. A frequency $f_{CK}$ of the counter clock CK may be variable. The cycle counter 610 measures a cycle T of the RPM signal FG based on the counter clock CK to generate a digital measurement value $D_{MEAS}$.

It is assumed that a target cycle of the RPM signal FG is $T_{REF}$. The target cycle is inversely proportional to the target RPM TARGET_RPM of the motor 302, and may be represented using a constant K as follows.

$$T_{REF} = K/\text{TARGET\_RPM}$$

In the above equation, the constant K is determined according to the number of phases and the number of poles of the motor.

The controller 630 generates the control command CNT based on a digital target value $D_{REF}$ corresponding to the target cycle $T_{REF}$ of the RPM signal FG and the measurement value $D_{MEAS}$.

The controller 630 is configured such that a first mode and a second mode can be selected. In the first mode, the controller 630 monotonically changes the control command CNT, i.e., an output duty ratio PWM_OUT. Further, in the second mode, the controller 630 generates the control command CNT by proportional-integral (PI) control based on an error ΔD between the target value $D_{REF}$ and the measurement value $D_{MEAS}$.

The mode switching method is not particularly limited, and may be specified according to a type or use of the motor, or may be specified by taking into account an allowable ringing amount of RPM, an allowable stabilization time (delay time) of RPM, or the like.

The switching from the second mode to the first mode may be triggered according to a change in the target cycle.

The switching from the first mode to the second mode may be triggered according to a ratio of an actual RPM REAL_RPM to the target RPM TARGET_RPM. When the RPM is increased, if a value obtained by multiplying the target RPM TARGET_PRM by a predetermined ratio (for example, 90%) is set as a threshold value TH_RPM and the actual RPM REAL_RPM crosses the threshold value TH_RPM, the mode may be switched to the second mode.

What is measured by the control circuit 600 is not the RPM but the cycle of the RPM signal FG. Therefore, the controller 630 may generate a trigger for switching from the second mode to the first mode according to the ratio of the measurement value $D_{MEAS}$ to the target value $D_{REF}$ of the RPM signal FG. That is, when the RPM is increased, if a value obtained by multiplying the target value $D_{REF}$ by a predetermined ratio (for example, 110%) is set as a threshold value $D_{TH}$ and the measurement value $D_{MEAS}$ decreases to the threshold value $D_{TH}$, the mode may be switched to the second mode.

When the RPM is decreased, a reverse process may be performed. That is, if a value obtained by multiplying the target RPM TARGET_PRM by a predetermined ratio (for example, 110%) is set as the threshold value TH_RPM and the actual RPM REAL_RPM decreases to the threshold value TH_RPM, the mode may be switched to the second mode. Based on the RPM signal FG, if a value obtained by multiplying the target value $D_{REF}$ of the RPM signal FG by a predetermined ratio (for example, 90%) is set as the threshold value $D_{TH}$ and the measurement value $D_{MEAS}$ crosses the threshold value $D_{TH}$, the controller 630 may switch the mode to the second mode.

A configuration example of the controller 630 will be described. The controller 630 includes a target value setting part 632, a ramp waveform generator 634, a PI controller 636, and a mode selector 638.

The target value setting part 632 sets the digital target value $D_{REF}$ according to the target cycle $T_{REF}$. The ramp waveform generator 634 is effective in the first mode and monotonically changes the control command CNT. Specifically, when the target cycle after the change is shorter than the target cycle before the change, i.e., when the target RPM TARGET_RPM is increased, the control command is monotonously increased, and when the target cycle after the change is longer than the target cycle before the change, i.e., when the target RPM TARGET_RPM is decreased, the control command is monotonously decreased. In one embodiment, the ramp waveform generator 634 may increase or decrease the control command CNT with a constant slope.

The PI controller 636 is effective in the second mode and generates the control command CNT by PI control. The PI controller 636 includes an error detector 640 and a PI operator 642. The error detector 640 detects an error ΔD corresponding to a difference between the target value $D_{REF}$ and the measurement value $D_{MEAS}$. For example, the error ΔD may be a subtractor that subtracts the measurement value $D_{MEAS}$ from the target value $D_{REF}$.

The PI operator 642 executes a PI operation on the error ΔD and generates the control command value CNT.

$$CNT = K_P \times \Delta D + K_I \times \Sigma \Delta D$$

In the above equation, $K_P$ indicates a proportional gain, and $K_I$ indicates an integral gain.

The mode selector 638 switches between the ramp waveform generator 634 and the PI controller 636. For example, the mode selector 638 controls the mode based on the target value $D_{REF}$ of the RPM signal FG and the measurement value $D_{MEAS}$.

The configuration of the control circuit 600 has been described above. Next, an operation thereof will be described.

Figure 3:
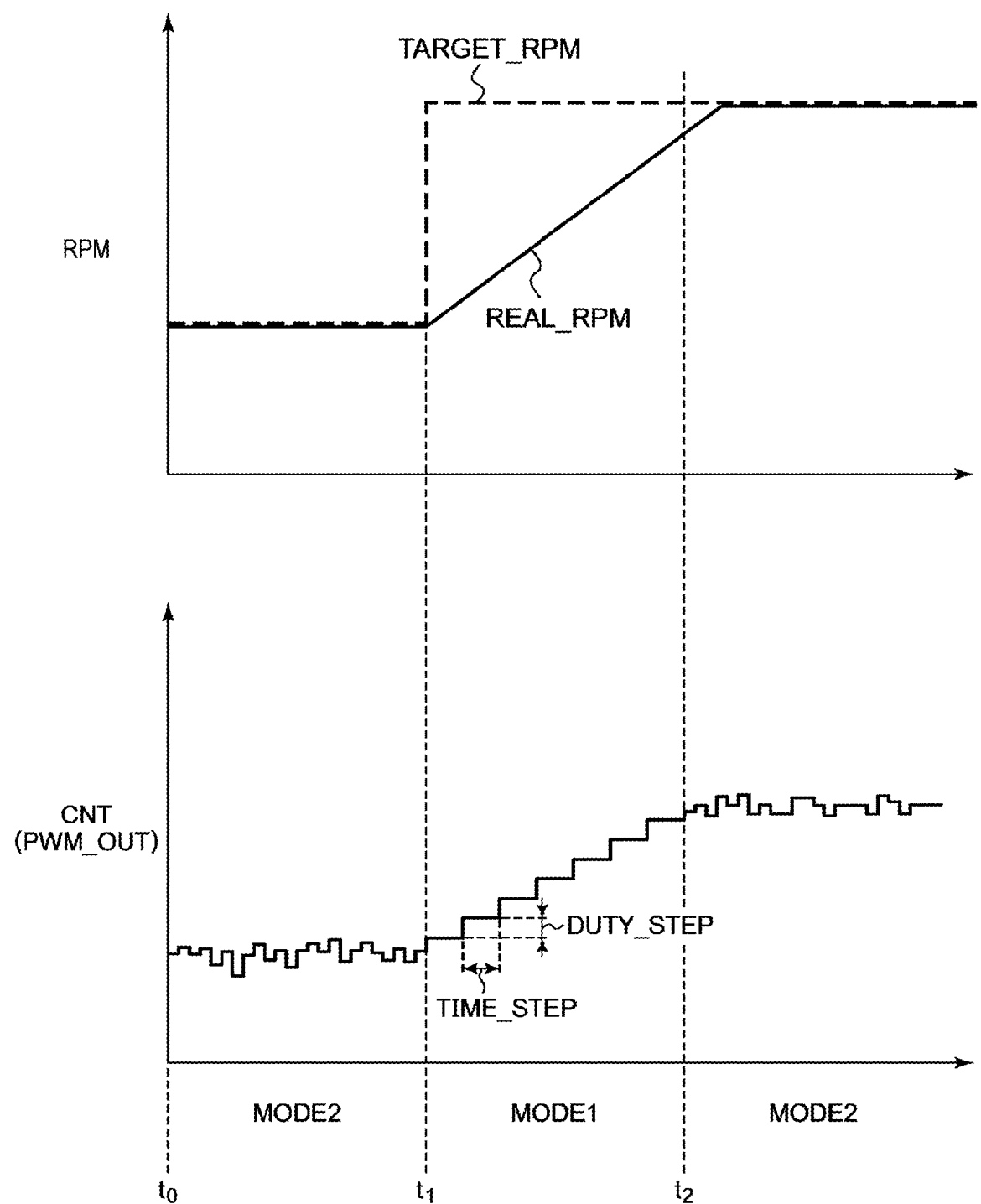
FIG. 3 is an operation waveform diagram of the control circuit when an RPM is increased.

FIG. 3 is an operation waveform diagram of the control circuit 600 when the RPM is increased. Between time to and time $t_1$, the actual RPM REAL_RPM is stabilized at the target RPM TARGET_RPM, and is operating in the second mode (PI control).

When the target RPM TARGET_RPM increases at the time $t_1$, the mode is switched to the first mode. An initial value of the control command CNT (output duty ratio PWM_OUT) in the first mode is a value in the immediately preceding second mode. In the first mode, the value of the control command CNT increases by a predetermined width DUTY_STEP every predetermined time step TIME_STEP. As the control command CNT, i.e., the output duty ratio PWM_OUT increases, the actual RPM of the motor increases. In some embodiments, the TIME_STEP and DUTY_STEP may be externally settable by a register.

When the actual RPM RPM_REAL sufficiently approaches the target RPM TARGET_RPM at the time $t_2$, the mode is switched to the second mode, and thereafter, the control command CNT is generated by the PI control.

Figure 4:
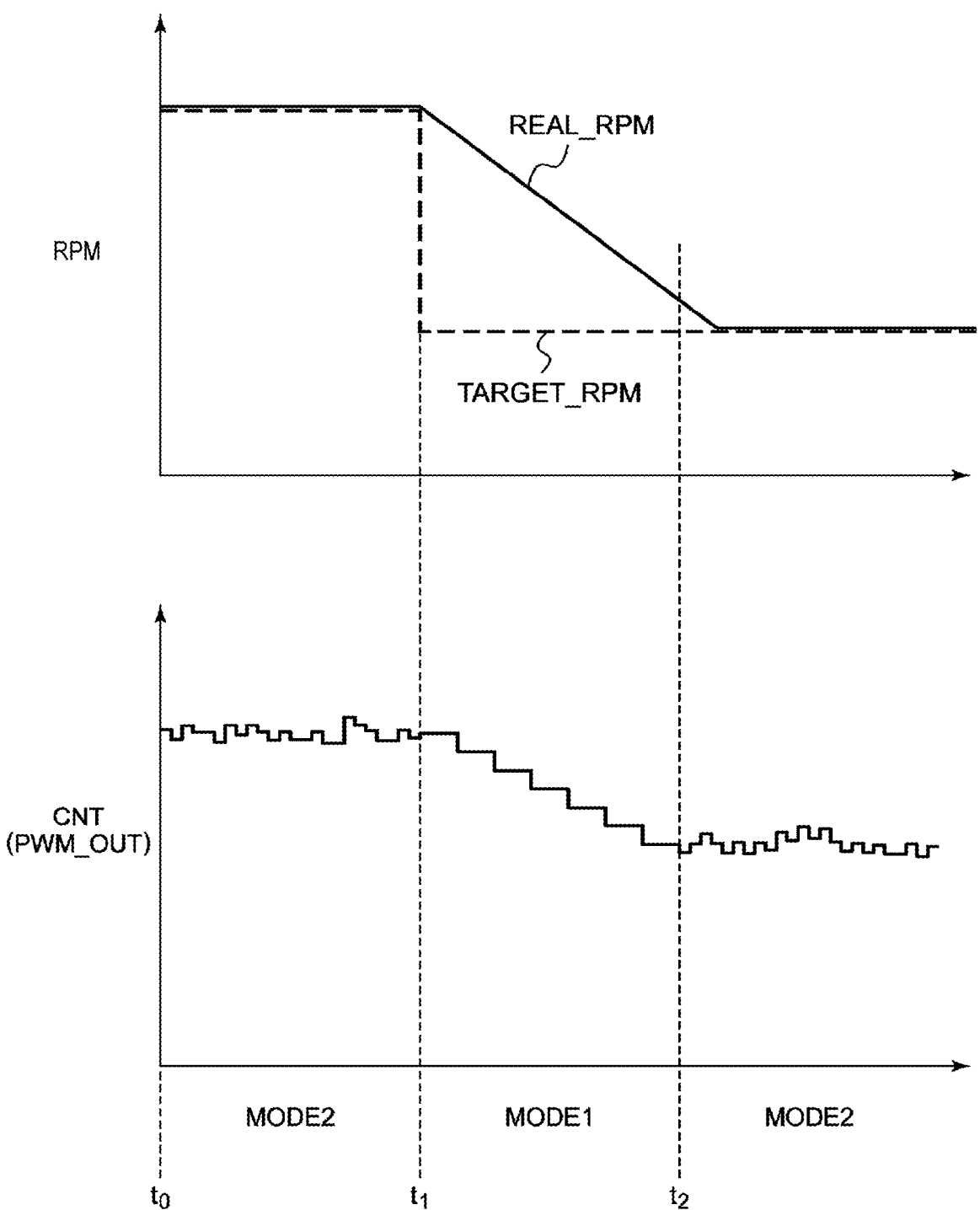
FIG. 4 is an operation waveform diagram of the control circuit when an RPM is decreased.

FIG. 4 is an operation waveform diagram of the control circuit 600 when the RPM is decreased. Between the time to and the time $t_1$, the actual RPM REAL_RPM is stabilized at the target RPM TARGET_RPM, and is operating in the second mode (PI control).

When the target RPM TARGET_RPM decreases at the time $t_1$, the mode is switched to the first mode. An initial value of the control command CNT (output duty ratio PWM_OUT) in the first mode is a value in the immediately preceding second mode. In the first mode, the value of the control command CNT decreases by the predetermined width DUTY_STEP every predetermined time step TIME_STEP. Further, the same value may be used or different values may be set for TIME_STEP and DUTY_STEP when the RPM is increased or decreased. As the control command CNT, that is, the output duty ratio PWM_OUT decreases, the actual RPM of the motor decreases.

Then, when the actual RPM RPM_REAL sufficiently approaches the target RPM TARGET_RPM at the time $t_2$, the mode is switched to the second mode, and thereafter, the control command CNT is generated by the PI control.

Figure 5:
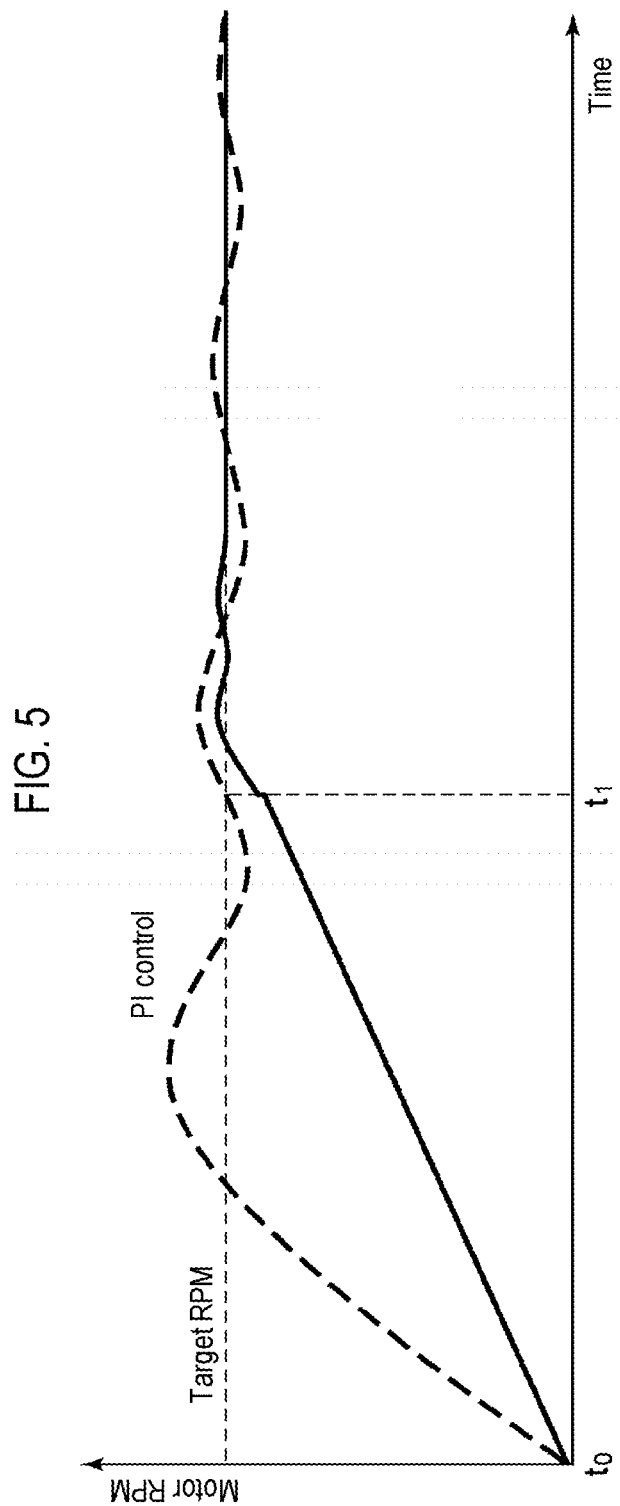
FIG. 5 is an operation waveform diagram of the control circuit in FIG. 2.

FIG. 5 is an operation waveform diagram of the control circuit 600 in FIG. 2. Illustrated here is an operation when the RPM of the motor is increased from zero to another target RPM. For comparison, the waveform of the RPM when fixed to the second mode is indicated by a broken line. This corresponds to when the control command CNT is generated only by the PI control as illustrated in FIG. 1, which causes an overshoot.

On the other hand, during the times $t_0$ to $t_1$, the first mode is selected and, after the actual RPM sufficiently approaches the target RPM, the mode is switched to the second mode, which causes transition to the PI control, thereby suppressing the overshoot.

Similarly, it is possible to suppress an undershoot when the RPM is decreased.

The present disclosure is recognized by the block diagram of FIG. 2 or intended to cover various devices and methods derived from the aforementioned description, but is not limited to the specific configuration. Hereinafter, more specific configuration examples or embodiments will be described in order to help understand and clarify the essence or principal of operation of the present disclosure, rather than to narrow the scope of the present disclosure.

Figure 6:
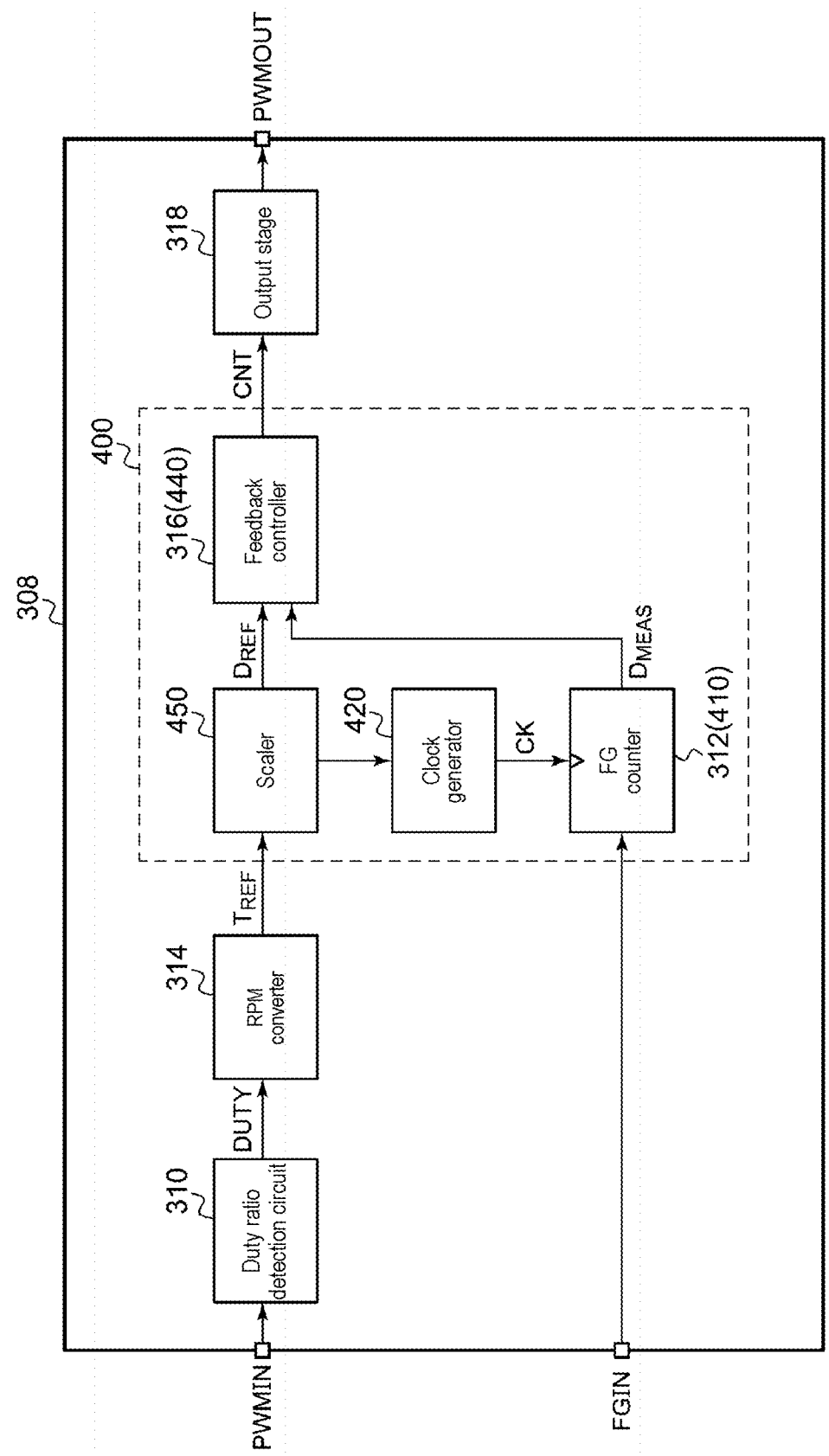
FIG. 6 is a diagram illustrating a motor drive system using the control circuit according to an embodiment of the present disclosure.

FIG. 6 is a diagram illustrating a motor drive system 300 using the control circuit 600 according to an embodiment of the present disclosure. The motor drive system 300 receives a PWMIN signal having a duty ratio corresponding to the target value of the RPM of the motor 302 from a CPU or a microcomputer (not shown), and feedback-controls the motor 302 such that the RPM of the motor 302 approaches a target RPM corresponding to the PWMIN signal.

A speed controller 308 receives the PWMIN signal and an RPM detection signal indicating the actual RPM of the motor 302, and generates a control signal CNT such that the target RPM indicated by the PWMIN signal and an RPM detection value indicated by the RPM detection signal approach each other. For example, the RPM detection signal may be a frequency generation (FG) signal having a frequency corresponding to the RPM. The control signal CNT corresponds to a voltage command value indicating a drive voltage to be applied to the motor 302, specifically, corresponds to a command value of the switching duty ratio of the inverter 304.

The control signal CNT may be an analog voltage or a digital signal indicating the duty ratio, or may be a PWM signal having such a duty ratio.

The driver 306 generates a PWM signal having a duty ratio corresponding to the control signal CNT, and PWM-drives the inverter 304 depending on the PWM signal. In FIG. 6, the driver 306 and the speed controller 308 may be combined and integrated into a single functional IC.

Figure 7:
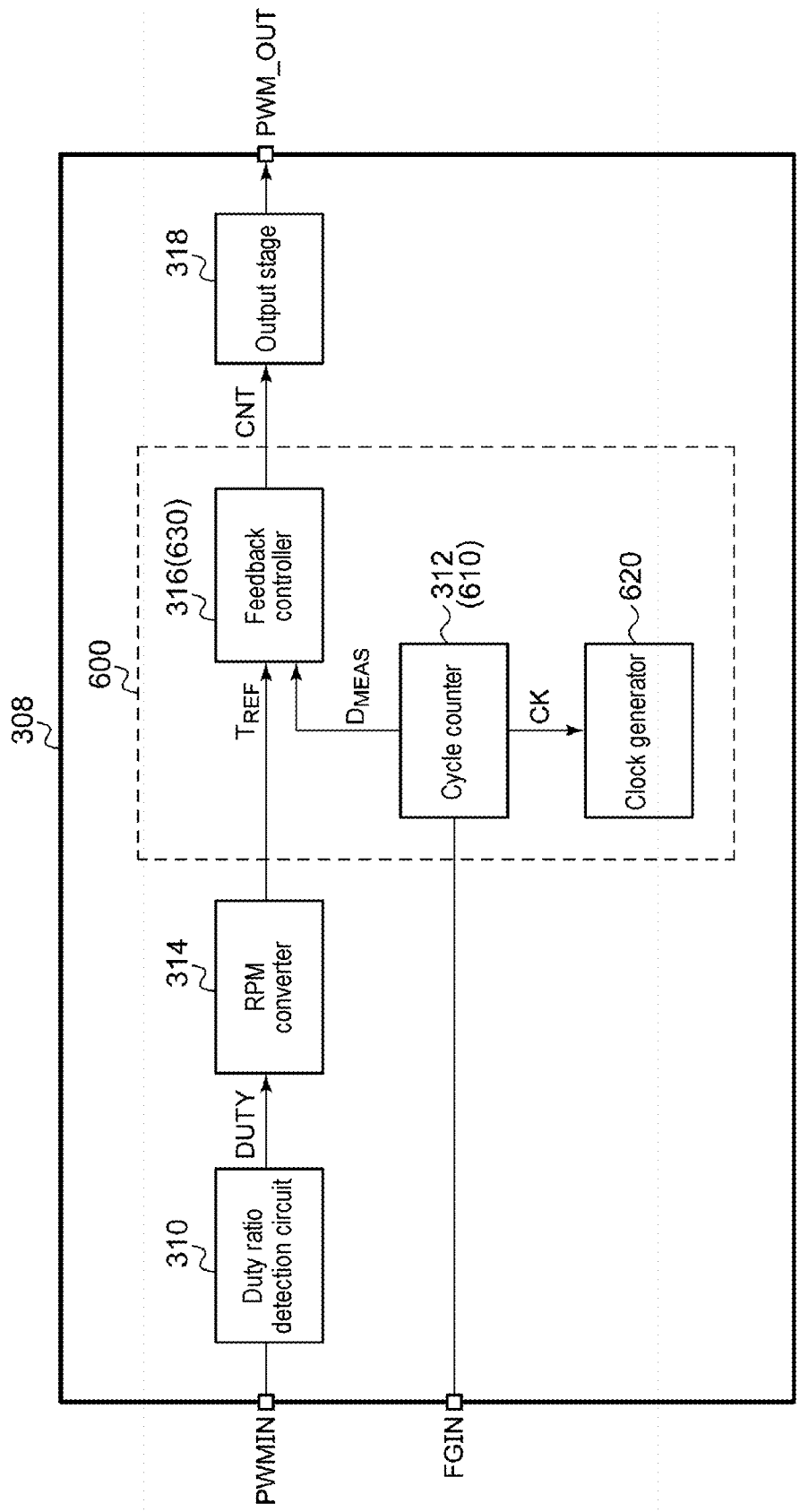
FIG. 7 is a circuit diagram of a speed controller in FIG. 6.

The configuration of the motor drive system 300 has been described above. Next, a specific configuration of the speed controller 308 will be described. FIG. 7 is a circuit diagram of the speed controller 308 in FIG. 6. The speed controller 308 is configured using the architecture of the control circuit 600.

The speed controller 308 includes a PWMIN pin, an FGIN pin, and a PWMOUT pin. The PWMIN signal indicating the RPM command value is input to the PWMIN pin, and the FG signal indicating the RPM detection value is input to the FGIN pin.

A duty ratio detection circuit 310 of the speed controller 308 corresponds to the duty ratio detection circuit 200 in FIG. 2, and generates a digital signal DUTY indicating the duty ratio of the PWMIN signal.

An FG counter 312 corresponds to the cycle counter 610 in FIG. 2 and measures the cycle of the FG signal to output a measurement value $D_{MEAS}$.

An RPM converter 314 is configured to make the duty ratio DUTY detected by the duty ratio detection circuit 310 and the target cycle $T_{REF}$ correspond to each other and set the target cycle $T_{REF}$ corresponding to the duty ratio DUTY.

Figure 8:
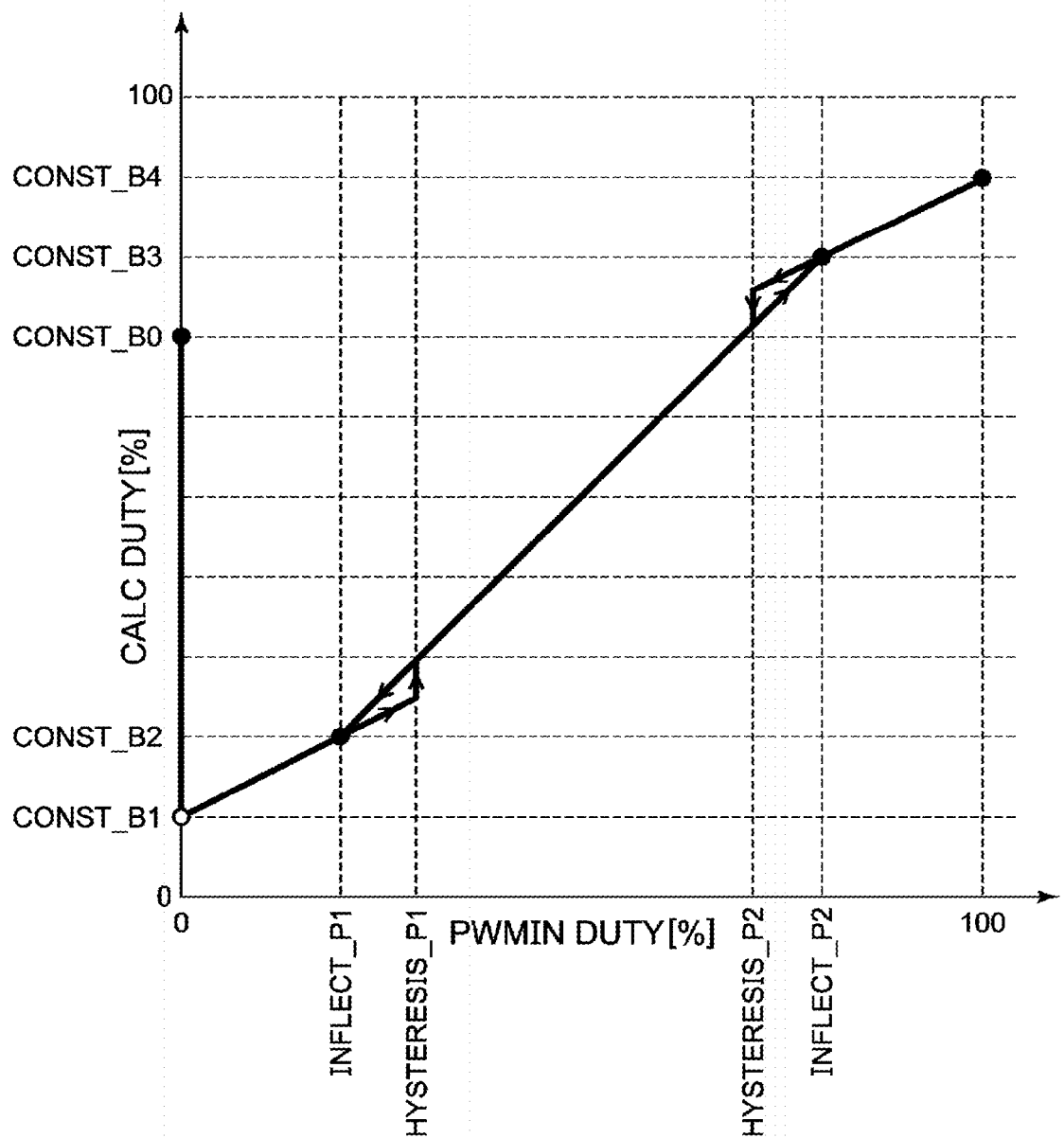
FIG. 8 is a diagram illustrating a relationship between an input duty ratio PWMIN_DUTY and an intermediate duty ratio CALC_DUTY.

The RPM converter 314 may convert the input duty ratio PWMIN_DUTY measured by the duty ratio detection circuit 310 into an intermediate duty ratio CALC_DUTY and set the target RPM to be proportional to the intermediate duty ratio CALC_DUTY. FIG. 8 is a diagram illustrating a relationship between the input duty ratio PWMIN_DUTY and the intermediate duty ratio CALC_DUTY. This correspondence relationship is defined by using a plurality of parameters. The parameters may be set by a register.

INFLECT_P1: Inflection point 1 of PWMIN_DUTY
INFLECT_P2: Inflection point 2 of PWMIN_DUTY
HYSTERESIS_P1: Hysteresis width for inflection point 1
HYSTERESIS_P2: Hysteresis width for inflection point 2
CONST_B0: CALC_DUTY corresponding to PWMIN_DUTY=0%
CONST_B1: CALC_DUTY (which specifies a slope in range of 0%<PWMIN_DUTY) corresponding to PWMIN_DUTY=0%
CONST_B2: CALC_DUTY for inflection point 1
CONST_B3: CALC_DUTY for inflection point 2
CONST_B4: CALC_DUTY corresponding to PWMIN_DUTY=100%

The inflection point is set by comparing PWMIN_DUTY with each of INFLECT_P1 and INFLECT_P2.

Hysteresis width Δ1=INFLECT_*P*1+HYSTERESIS_*P*1

Hysteresis width Δ2=INFLECT_*P*2+HYSTERESIS_*P*2

The duty ratio CALC_DUTY is calculated from the following equation.

CALC_DUTY=(*Y*2−*Y*1)/(*X*2−*X*1)×PWMIN_DUTY+*Y*1

In the above equation, X1, X2, Y1 and Y2 indicate the following respectively:

X1: Duty set value (0%, INFLECT_P1, P2) on low side closest to PWMIN_DUTY
X2: Duty set value (0%, INFLECT_P1, P2, 100%) on high side closest to PWMIN_DUTY
Y1: Duty set value (CONST_B0, B1, B2, B3) corresponding to X1
Y2: Duty set value (CONST_B1, B2, B3, B4) corresponding to X2

By converting PWMIN_DUTY into CALC_DUTY, flexible RPM control based on the parameters becomes possible.

Returning to FIG. 7, the RPM converter 314 has a base RPM BASE_RPM as a parameter, BASE_RPM×CALC_DUTY may be set as the target RPM TARGET_RPM, and the target cycle $T_{REF}$ may be set according to its inverse number. For example, the RPM converter 314 may set the target cycle $T_{REF}$ by $T_{REF}$=A/CALC_DUTY when A is a constant.

The control circuit 600 is as described with reference to FIG. 2. The feedback controller 316 corresponds to the controller 630 in FIG. 2, and generates the voltage command value CNT such that the target value $D_{REF}$ approaches the measurement value $D_{MEAS}$, in other words, such that an error between them approaches zero. As described above, the controller 630 generates the voltage command value CNT according to the two modes.

An output stage 318 converts the voltage command value CNT into a format appropriate for the driver 306 in FIG. 6, and outputs it. For example, if the driver 306 at the subsequent stage has an interface for the PWM signal, the output stage 318 may be configured by a PWM signal generator that converts the voltage command value CNT into a PWMOUT signal having a duty ratio corresponding to that value.

If the driver 306 at the subsequent stage of the speed controller 308 has an interface for a digital signal, the output stage 318 may be configured by an interface circuit such as I²C or the like. In addition, if the driver 306 at the subsequent stage has an interface for an analog signal, the output stage 318 may be configured by a D/A converter.

Figure 9:
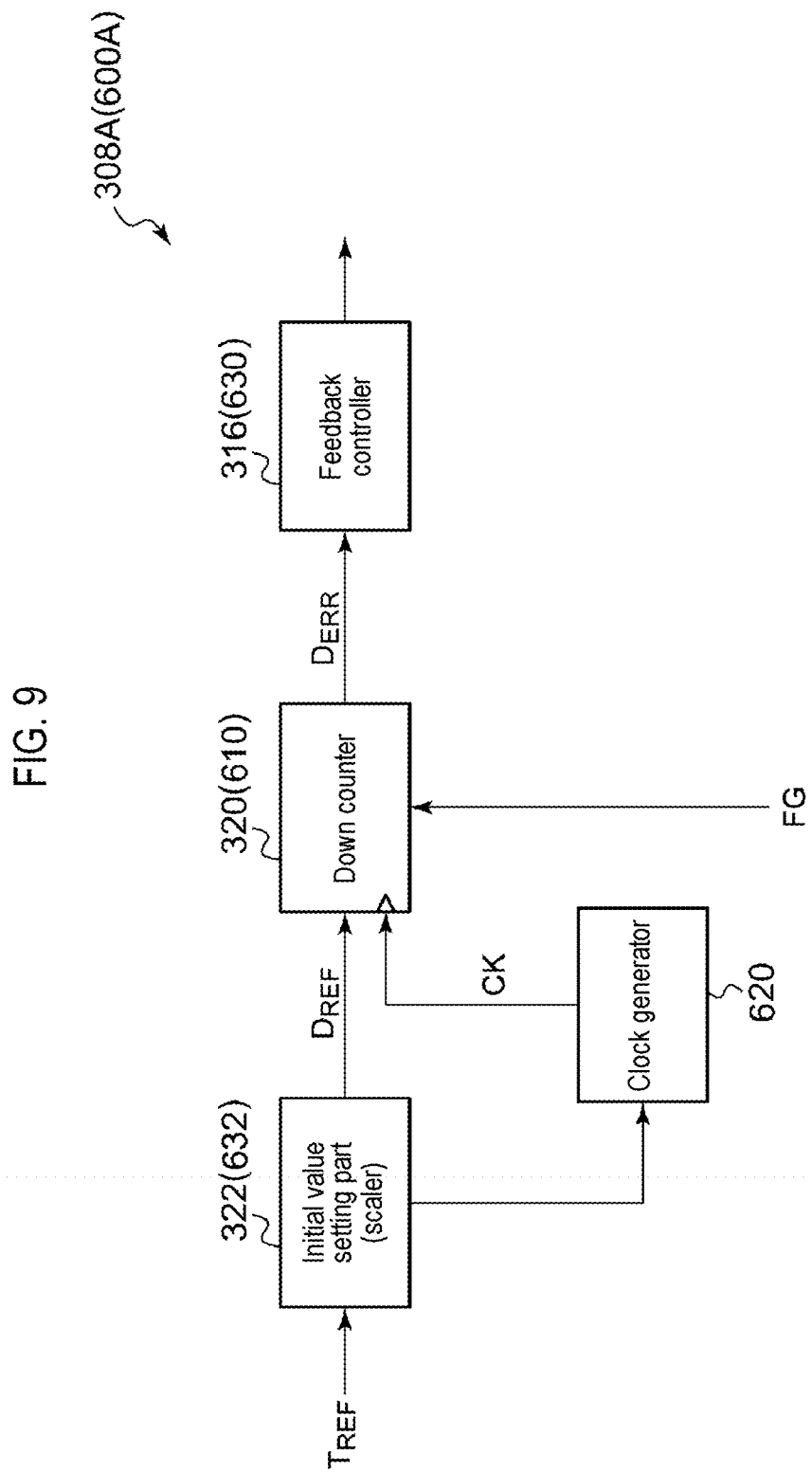
FIG. 9 is a block diagram of a speed controller (control circuit) according to an exemplary modification.

FIG. 9 is a block diagram of a speed controller 308A (control circuit 600A) according to an exemplary modification. In FIG. 9, only a part of the speed controller 308A corresponding to the control circuit 600A is illustrated, and the remaining blocks are omitted.

A down counter 320 is configured to correspond to the cycle counter 610. The down counter 320 repeats a counting operation according to an edge of the RPM signal FG.

An initial value setting part 322 is configured to correspond to the target value setting part 632 in FIG. 2. The initial value setting part 322 sets an initial value $D_{INIT}$ of the down counter 320 according to the target cycle $T_{REF}$ corresponding to the target RPM of the motor 302. The initial value $D_{INIT}$ corresponds to the target value $D_{REF}$ described above.

The count number counted down from the start of counting until the completion of counting by the down counter 320 corresponds to the measurement value $D_{MEAS}$ of the cycle of the RPM signal (FG signal). That is, the count value $D_{ERR}$ at the completion of counting by the down counter 320 is as follows.

$$D_{ERR}=D_{INIT}-D_{MEAS}=D_{REF}-D_{MEAS}$$

Figure 10:
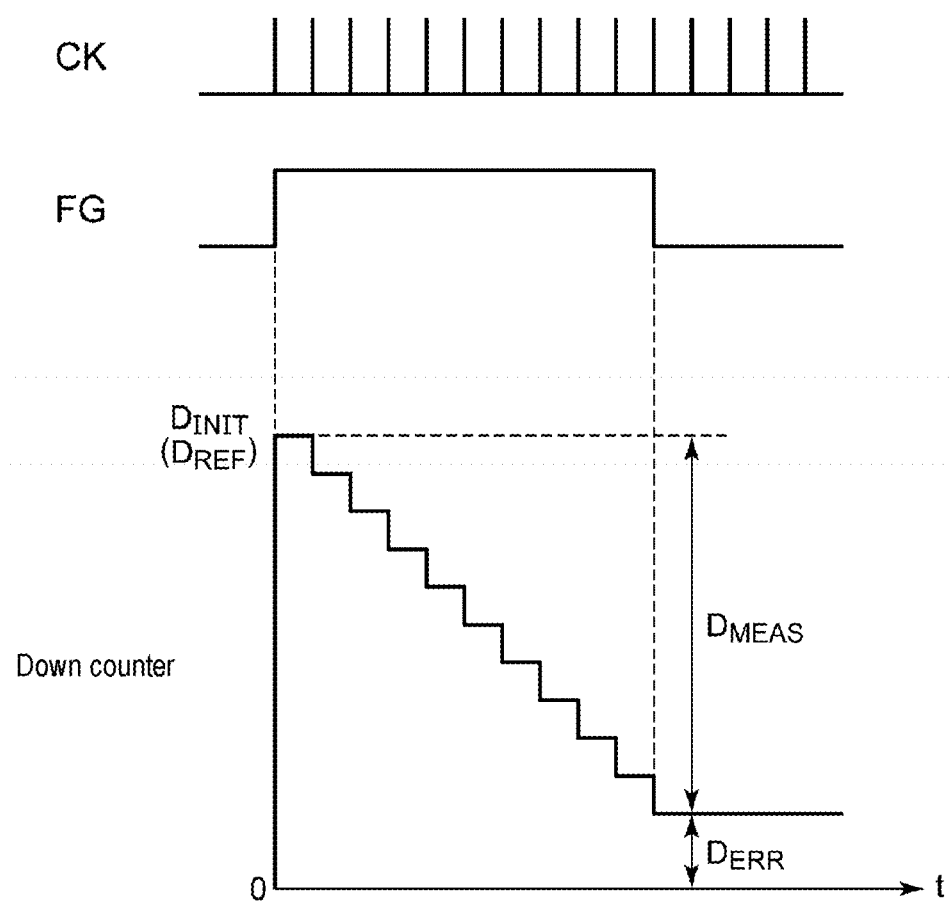
FIG. 10 is an operation waveform diagram of the control circuit in FIG. 9.

This corresponds to an error between the measurement value $D_{MEAS}$ of the cycle of the RPM signal FG and the target value $D_{REF}$. FIG. 10 is an operation waveform diagram of the control circuit 600A in FIG. 9.

The feedback controller 316 generates the control command CNT such that the output $D_{ERR}$ of the down counter 320 in the second mode approaches zero. A trigger for switching from the first mode to the second mode may also be generated based on a comparison result between the output of the down counter 320 and a predetermined threshold value.

According to the control circuit 600A in FIG. 9, it is possible to simultaneously measure the cycle of the RPM signal FG and calculate the error between the cycle of the revolution number signal FG and the target cycle, simplifying the hardware.

Figure 11:
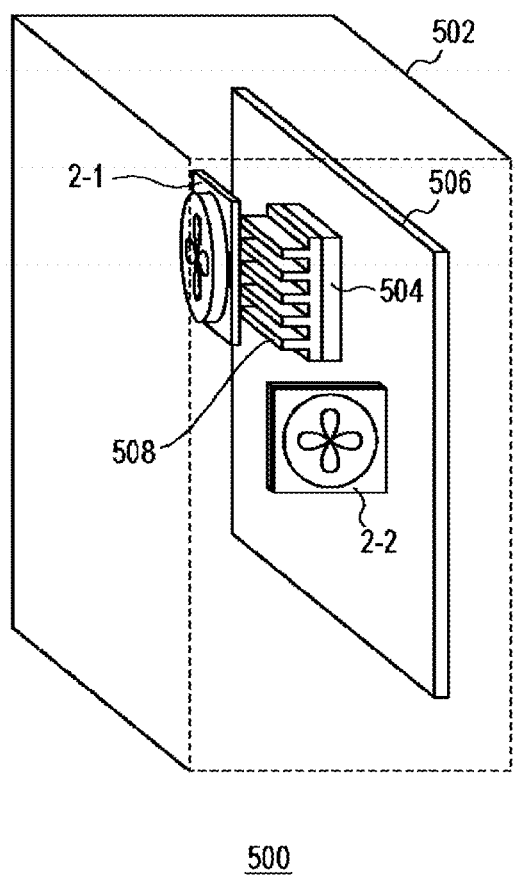
FIG. 11 is a diagram illustrating a computer including a cooling device.

The motor drive system 300 may be applied to a cooling device including a fan motor. That is, the motor 302 is a fan motor, and the PWMIN signal may be used as the command value of the RPM of the fan motor. FIG. 11 is a diagram illustrating a computer including a cooling device 2. The computer 500 includes a housing 502, a CPU 504, a mother board 506, a heat sink 508, and a plurality of cooling devices 2.

The CPU 504 is mounted on the mother board 506. The heat sink 508 is in close contact with an upper surface of the CPU 504. A cooling device 2_1 is installed to face the heat sink 508 and blows air to the heat sink 508. A cooling device 2_2 is installed on a rear surface of the housing 502, and transmits external air into the housing 502.

The cooling device 2 may be mounted on various electronic devices such as a workstation, a notebook computer, a television, a refrigerator, and the like, in addition to the computer 500 in FIG. 11.

The present disclosure has been described above with reference to the embodiments. It is to be understood by those skilled in the art that the embodiments are merely illustrative and may be differently modified by any combination of the components or processes, and such modifications are also within the scope of the present disclosure. Hereinafter, these modifications will be described.

(First Modification)

In FIG. 7, the three-phase motor is taken as an example, but the present disclosure may also be applied to driving a single-phase motor.

(Second Modification)

The switching from the first mode to the second mode may be triggered depending on an error $\Delta D$ between the target value $D_{REF}$ and the measurement value $D_{MEAS}$. That is, when the error $\Delta D$ becomes sufficiently small, it is possible to limit an overshoot or an undershoot by making the PI control effective.

(Third Modification)

In the embodiment, the control command CNT is changed at a constant slope in the first mode, but is not limited thereto. For example, the control command CNT may be changed according to a quadratic function or a cubic function, or may be changed according to an exponential function, or may be changed based on any other arbitrary function.

In addition, the motor drive system may be applied to a wide range of applications including motors, such as electric cars or hybrid cars, and the applications thereof are not particularly limited.

According to the present disclosure in some embodiments, it is possible to limit the overshoot or the undershoot due to a change in RPM.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A control circuit, comprising:
   a cycle counter configured to measure a cycle of revolutions per minute (RPM) signal indicating an RPM of a motor to be driven to generate a digital measurement value; and
   a controller configured to generate a control command based on a digital target value corresponding to a target cycle of the RPM signal and the measurement value,
   wherein the controller switches between a first mode in which the control command is monotonously changed and a second mode in which the control command is generated based on proportional-integral (PI) control,
   wherein the controller is further configured to control switching from the second mode to the first mode during a period of time in which the RPM of the motor, which has been stabilized, increases, and
   wherein the controller is further configured to control switching from the first mode to the second mode during a period of time in which the RPM of the motor, which has decreased, is stabilized.

2. The control circuit of claim 1, wherein the control command is changed at a constant slope in the first mode.

3. The control circuit of claim 1, wherein the control command is changed according to a predetermined function in the first mode.

4. The control circuit of claim 1, wherein the switching from the first mode to the second mode is triggered depending on a ratio of the measurement value to the target value.

5. The control circuit of claim 1, wherein the switching from the first mode to the second mode is triggered depending on an error between the target value and the measurement value.

6. The control circuit of claim 1, wherein the switching from the second mode to the first mode is triggered depending on an upward change in the target cycle.

7. The control circuit of claim 1, wherein the controller includes:
   a ramp waveform generator configured to change the control command at a predetermined slope;
   a PI controller configured to generate the control command based on PI control; and
   a mode selector configured to switch the ramp waveform generator and the PI controller.

8. The control circuit of claim 1, wherein the control command indicates a duty ratio when the motor is driven.

9. A motor drive system, comprising:
   a motor;
   the control circuit of claim 1; and
   a driver configured to drive the motor depending on the control command generated by the control circuit.

10. An electronic device, comprising:
    a processor;
    a fan motor configured to cool the processor;
    the control circuit of claim 1; and
    a driver configured to drive the fan motor depending on the control command generated by the control circuit.

11. A method of controlling a motor, comprising:
    measuring a cycle of an RPM signal indicating an RPM of a motor to be driven to generate a digital measurement value;

generating a control command based on a digital target value corresponding to a target cycle of the RPM signal and the measurement value;

generating a pulse signal having a duty ratio corresponding to the control command; and driving the motor depending on the pulse signal, wherein, when generating the control command, a first mode in which the control command is monotonically changed and a second mode in which the control command is generated based on proportional-integral (PI) control are selectable, wherein the first mode is selected in place of the second mode during a period of time in which the RPM of the motor, which has been stabilized, increases, and wherein the second mode is selected in place of the first mode during a period of time in which the RPM of the motor, which has decreased, is stabilized.

12. The method of claim 11, wherein, when a ratio between a target RPM and an actual RPM reaches a predetermined value, a mode shifts from the first mode to the second mode.

13. The control circuit of claim 6, wherein the controller is further configured to control switching from the first mode to the second mode when the RPM of the motor, which has increased, approaches an upwardly changed target cycle.

14. The control circuit of claim 1, wherein the controller is further configured to control switching from the second mode to the first mode triggered depending on a downwardly change in the target cycle.

15. The control circuit of claim 14, wherein the switching from the first mode to the second mode is triggered when the RPM of the motor, which has decreased, approaches a downwardly changed target cycle.

* * * * *